US 12,255,584 B2

(12) United States Patent
Strandvik et al.

(10) Patent No.: US 12,255,584 B2
(45) Date of Patent: Mar. 18, 2025

(54) AMPLITUDE REGULATOR FOR CRYSTAL OSCILLATOR

(71) Applicant: Nordic Semiconductor ASA, Trondheim (NO)

(72) Inventors: Erlend Strandvik, Trondheim (NO); Hsin-Ta Wu, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 18/037,259

(22) PCT Filed: Nov. 19, 2021

(86) PCT No.: PCT/EP2021/082297
§ 371 (c)(1),
(2) Date: May 16, 2023

(87) PCT Pub. No.: WO2022/106617
PCT Pub. Date: May 27, 2022

(65) Prior Publication Data
US 2023/0421100 A1    Dec. 28, 2023

(30) Foreign Application Priority Data
Nov. 19, 2020    (GB) .................................... 2018190

(51) Int. Cl.
H03B 5/06    (2006.01)
H03B 5/36    (2006.01)
(Continued)

(52) U.S. Cl.
CPC .............. *H03B 5/364* (2013.01); *H03B 5/06* (2013.01); *H03L 3/00* (2013.01); *H03L 5/00* (2013.01);
(Continued)

(58) Field of Classification Search
CPC ... H03B 5/06; H03B 5/30; H03B 5/32; H03B 5/36; H03B 5/362; H03B 5/364;
(Continued)

(56) References Cited

U.S. PATENT DOCUMENTS 5,905,412 A    5/1999    Rasmussen
5,923,222 A    7/1999    Russell
(Continued)

FOREIGN PATENT DOCUMENTS

EP    2 439 842          4/2012
EP    2720371 A1 *      4/2014    ............... H03B 5/32
EP    3 499 719          6/2019

OTHER PUBLICATIONS

IPO Search Report under Section 17(5) for GB2018190.5, mailed Jan. 4, 2021, 4 pages.
(Continued)

*Primary Examiner* — Levi Gannon
(74) *Attorney, Agent, or Firm* — Klarquist Sparkman, LLP

(57) ABSTRACT

An electronic device comprises an oscillator circuit portion comprising an inverter and a crystal oscillator connected between the input and output terminals of the inverter. An amplitude regulator circuit portion is arranged to supply a current to the inverter. The amplitude regulator monitors a voltage at the input of the inverter and varies the current supplied to the inverter in response to the monitored voltage. The amplitude regulator comprises a trimmable resistor arranged such that the voltage at the input of the inverter is set to an operating point when the supply current is equal to a threshold value, the operating point being at least partly determined by the selected resistance of the resistor. A current monitor is arranged to monitor the current supplied to the inverter during operation and to determine therefrom
(Continued)

whether the voltage at the input terminal of the inverter is within a predetermined range.

17 Claims, 4 Drawing Sheets

(51) Int. Cl.
  *H03L 3/00* (2006.01)
  *H03L 5/00* (2006.01)
(52) U.S. Cl.
  CPC ................ *H03B 2200/0012* (2013.01); *H03B 2200/0094* (2013.01)
(58) Field of Classification Search
  CPC ............ H03B 5/366; H03B 2200/0012; H03B 2200/0038; H03B 2200/0066; H03B 2200/0094; H03B 2201/031; H03L 3/00; H03L 5/00; H03L 5/02
  See application file for complete search history.

(56) References Cited

U.S. PATENT DOCUMENTS

| | | | |
|---|---|---|---|
| 7,868,710 B1* | 1/2011 | Farahvash | H03B 5/366 331/177 V |
| 8,816,786 B2 | 8/2014 | Tham | |
| 9,054,637 B1 | 6/2015 | Mittal et al. | |
| 9,344,036 B1* | 5/2016 | Chang | H03B 5/1278 |
| 2006/0017598 A1 | 1/2006 | Hales et al. | |
| 2006/0119447 A1 | 6/2006 | Hagino | |
| 2006/0164178 A1 | 7/2006 | Matsuura | |
| 2007/0188256 A1 | 8/2007 | Maheshwari | |
| 2008/0048795 A1* | 2/2008 | Hoshino | H03L 5/00 331/109 |
| 2009/0261914 A1 | 10/2009 | Kao et al. | |
| 2011/0037524 A1* | 2/2011 | Dao | H03B 5/362 331/47 |
| 2014/0091869 A1* | 4/2014 | Tham | H03B 5/06 331/109 |
| 2014/0210565 A1 | 7/2014 | Vilas Boas | |
| 2015/0061786 A1 | 3/2015 | Mai | |
| 2015/0180410 A1* | 6/2015 | Yamamoto | H03B 5/04 331/70 |
| 2020/0177127 A1 | 6/2020 | Hao | |
| 2020/0244223 A1* | 7/2020 | Yamamoto | H03B 5/368 |
| 2021/0273610 A1* | 9/2021 | Telstø | H03B 5/366 |
| 2024/0022210 A1 | 1/2024 | Wu | |

OTHER PUBLICATIONS

International Search Report and Written Opinion for PCT/EP2021/082297, mailed Mar. 14, 2022, 16 pages.

* cited by examiner

AMPLITUDE REGULATOR FOR CRYSTAL OSCILLATOR

CROSS REFERENCE TO RELATED APPLICATIONS

This is the U.S. National Stage of International Application No. PCT/EP2021/082297, filed Nov. 19, 2021, which was published in English under PCT Article 21 (2), which in turn claims the benefit of Great Britain Application No. 2018190.5, filed Nov. 19, 2020.

TECHNICAL FIELD

The present invention relates to an amplitude regulator suitable for use with oscillator circuits, particularly but not exclusively an amplitude regulator for use with a Pierce oscillator.

Background

It is a common aim in modern electronic devices to provide a signal having a particular frequency, for example to be used as a clock signal for timing events within other parts of the circuit. An electronic oscillator is an electronic circuit that produces a periodic, oscillating electronic signal, often a sine wave or a square wave.

An oscillator that provides a sinusoidal signal is referred to in the art as a linear oscillator. Typically, a linear oscillator is constructed from an amplifier (e.g. a transistor or operational amplifier) provided with feedback such that its output is fed back into its input through a frequency selective filter in order to provide positive feedback. On powering up, noise in the circuit provides a non-zero signal and this noise is amplified by the feedback loop and filtered until it converges on a sine wave at a single frequency. This generally occurs fairly quickly after powering up the circuit.

Linear oscillators include resistor-capacitor (RC) oscillator circuits, which use a network of resistors and capacitors as the filter; inductor-capacitor (LC) oscillator circuits, which use a network of inductors and capacitors as the filter, and crystal oscillator circuits, which use a piezoelectric crystal (e.g. a quartz crystal) as the filter. It is understood in the art that such crystals may have very high Q-factor and also better temperature stability than tuned circuits, so crystal oscillators have much better frequency stability than LC or RC oscillators.

Some such crystal oscillator circuits, for example those based on the arrangement described in "High-Performance Crystal Oscillator Circuits: Theory and Application," E. A. Vittoz et al., IEEE JSSC June 1988, may use an amplitude regulator circuit to generate the current which is supplied to a so-called 'Pierce inverter' which drives the crystal, where such an arrangement is often referred to as a 'Pierce oscillator'. The amplitude regulator circuit portion limits the current supplied to the Pierce inverter—referred to herein as the 'Pierce current (IPIERCE)—such that the gain is just above the level where oscillations are maintained, where this threshold is referred to as I_threshold. The amplitude regulator is provided with a feedback loop such that the current can be maintained at the appropriate level.

However, such arrangements have the disadvantage that conventional amplitude regulators, known in the art per se, that are used with oscillator circuits such as a Pierce oscillator may generate too much phase noise for certain applications, and may also have high power requirements than is desirable.

In order to determine whether the amplitude regulator is operating the oscillator circuit correctly, it is important to know the crystal input voltage Vamp_XC1 because if this voltage Vamp_XC1 is too high or too low, this has an adverse affect on phase noise. However, those skilled in the art will appreciate that this voltage is inherently difficult to determine directly.

Some amplitude regulators, known in the art per se, use a peak detector that takes the crystal input voltage and crystal output voltage as two inputs, where the peak detector can determine the voltage amplitude at the input of the crystal Vamp_XC1. However, such a peak detector generally operates at the crystal frequency and due to this high speed operation, the peak detector generally consumes a significant amount of power during the voltage comparison purpose.

A further problem associated with conventional amplitude regulators is that their performance across process corners can vary significantly, as can be seen in FIG. 2 (described in further detail below), which shows a typical plot of IPIERCE vs Vamp_XC1 for a conventional amplitude regulator, known in the art per se. In particular, at fast corners, IPIERCE drops to I_threshold at a higher voltage amplitude at the input of the crystal Vamp_XC1 than in the typical case.

Conversely, at slow corners, IPIERCE drops to I_threshold at a lower value of Vamp_XC1. Due to this, the performance of a conventional amplitude regulator can be unpredictable, and thus it can be difficult to optimise the phase noise and power consumption of the amplitude regulator and associated oscillator circuit.

SUMMARY OF THE INVENTION

When viewed from a first aspect, the present invention an electronic device comprising:
  an oscillator circuit portion comprising an inverter having an input terminal and an output terminal, said oscillator circuit portion further comprising a crystal oscillator connected between the input and output terminals of the inverter;
  an amplitude regulator circuit portion arranged to supply a current to the inverter of the oscillator circuit portion, said amplitude regulator circuit portion being arranged to monitor a voltage at the input terminal of the inverter and to vary the current supplied to said inverter in response to said monitored voltage;
  wherein the amplitude regulator circuit portion comprises:
  a trimmable resistor arranged such that the voltage at the input terminal of the inverter is set to an operating point when the supply current provided by the amplitude regulator circuit portion is equal to a threshold value, wherein said operating point is at least partly determined by a selected resistance of the trimmable resistor; and
  a current monitor arranged to monitor the current supplied to the inverter during operation and to determine therefrom whether the voltage at the input terminal of the inverter is within a predetermined range.

This first aspect of the invention extends to an amplitude regulator circuit portion arranged to supply a current to an inverter in an oscillator circuit portion, said amplitude regulator circuit portion being arranged to monitor a voltage at the input terminal of the inverter and to vary the current supplied to said inverter in response to said monitored voltage;

wherein the amplitude regulator circuit portion comprises:
a trimmable resistor arranged such that the voltage at the input terminal of the inverter is set to an operating point when the supply current provided by the amplitude regulator circuit portion is equal to a threshold value, wherein said operating point is at least partly determined by a selected resistance of the trimmable resistor; and
a current monitor arranged to monitor the current supplied to the inverter during operation and to determine therefrom whether the voltage at the input terminal of the inverter is within a predetermined range.

Thus it will be appreciated that embodiments of the present invention provide an improved electronic device in which the amplitude regulator that supplies the current to the oscillator circuit (e.g. a Pierce oscillator) can be set to a given operating point where the relationship between the voltage at the input of the inverter (i.e. at the input to the crystal) and the current supplied to the inverter is predictable around that operating point.

By setting (or 'trimming') the resistance of the trimmable resistor to a suitable value, the relationship between the voltage $V_{amp\_XC1}$ at the input of the crystal and the supplied current IPIERCE (i.e. the $V_{amp\_XC1}$ vs (PIERCE curves) may advantageously be more predicable across corners. As outlined above, the voltage $V_{amp\_XC1}$ at the input of the crystal is difficult to determine directly. However, the supply current IPIERCE is set by the amplitude regulator and so if the relationship between this voltage and current is known and predictable around the operating point, the voltage $V_{amp\_XC1}$ at the input of the crystal can be determined from the current IPIERCE being supplied by the amplitude regulator. Thus once the operating point is set by trimming the resistance of the trimmable resistor, the approximate value of $V_{amp\_XC1}$ can be determined from the output of the current monitor.

The approximate peak-to-peak voltage $V_{pp\_XC1}$ at the input of the crystal can, in some embodiments, also be determined from the mapping between the voltage and current. Generally, the peak-to-peak voltage $V_{pp\_XC1}$ is double the voltage $V_{amp\_XC1}$ at the input of the crystal.

As outlined previously trimming this resistance can lead to the curves being closer together (i.e. less spread) between corners. Ideally, all curves would be perfectly overlapped, however this is not generally possible in practical systems. Trimming of this resistance provides a relatively simple way to get those curves as close to each other as possible. It will be appreciated that the value to which the resistance of the trimmable resistor should be set depends on the desired operating point as well as the characteristics of the specific implementation (i.e. the amplitude regulator, oscillator circuit, and chosen crystal). The appropriate resistance may be determined by simulation, in a manner known in the art per se. Determining the value may also rely on measurement (e.g. in a laboratory), where different crystals can be tested in order to determine a proper resistance setting for a given device.

In some embodiments, the operating point may be zero. In other words, the resistance of the trimmable resistor in the amplitude regulator may be set to a DC condition such that the supply current is equal to the threshold value when the amplitude of the voltage $V_{amp\_XC1}$ at the input of the crystal is zero ($V_{amp\_XC1}=0$). This may result in $V_{amp\_XC1}$ vs. IPIERCE curves for different corners which are closest to each other at $V_{amp\_XC1}=0$.

However, in practice, the amplitude of the voltage $V_{amp\_XC1}$ at the input of the crystal during normal operation will not be zero, and thus it may be preferable to set the operating point (i.e. the voltage at which the supply current is equal to the threshold value) to a non-zero value. As a result, the $V_{amp\_XC1}$ vs IPIERCE curves for the different corners are not closest at $V_{amp\_XC1}=0$ as in the case described above but will instead be closest at the non-zero operating point.

The appropriate non-zero value may depend on the particular implementation, however in some embodiments the operating point may be between approximately 200 mV and 400 mV, for example between approximately 225 mV and 375 mV. In some embodiments, the operating point is between approximately 300 mV and 375 mV. In a particular set of embodiments, the operating point is or is approximately 300 mV.

In some embodiments, the current monitor comprises a current comparator arranged to determine whether the voltage at the input terminal of the inverter is within the predetermined range. Such a current comparator may be arranged to compare the supply current to a lower bound and an upper bound, where the lower and upper bounds define the predetermined range. The lower and upper bounds may, in some embodiments, be provided to the comparator(s) as lower and upper reference currents, respectively. These reference currents may be provided to a respective reference input of the current comparator(s).

In some embodiments the current monitor may comprise more than two current comparators. Thus in some embodiments, the current monitor comprises a plurality of current monitors, wherein each current comparator compares the current supplied to the inverter to a respective current comparison threshold. This may provide improved accuracy by providing more levels to compare the current to (i.e. such an arrangement is more 'granular'). In order to provide different thresholds, different reference currents may be used and/or the copy of the supply current IPIERCE provided to each current comparator may be scaled differently using an appropriately scaled current mirror.

In some such embodiments, the current monitor comprises first and second current comparators, wherein the first current comparator compares the current supplied to the inverter to the lower bound; and wherein the second current comparator compares the current supplied to the inverter to the upper bound. These two current comparators can provide indication if $V_{amp\_XC1}$ is between the lower and upper bounds. As above, the lower and upper bounds may, in some embodiments, be provided to the first and second comparators as lower and upper reference currents, respectively.

As with the operating point, the lower and upper bound values may be selected as appropriate for a given implementation.

However, in some embodiments, the lower bound is between approximately 100 mV and 500 mV, for example between approximately 200 mV and 400 mV, such as between approximately 250 mV and 350 mV. In some examples the lower bound is or is approximately 300 mV.

In some potentially overlapping embodiments, the upper bound is between approximately 175 mV and 575 mV, for example between approximately 275 mV and 475 mV, such as between approximately 325 mV and 425 mV. In some examples the upper bound is or is approximately 375 mV.

For some crystals, the appropriate operating point, lower bound, and/or upper bound, (and/or any other current comparison threshold as appropriate) may be outside of the exemplary ranges outlined above. However, so long as we the resistance of the trimmable resistor is set according the particular implementation, the benefits of bringing the Vamp_XC1 vs. IPIERCE curves closer together across corners.

Current comparators consume less power compared with using a peak detector. By knowing the outputs of the current comparators to determine whether Vamp_XC1 is not within the desired range, some auto-calibration process can be triggered. It will be appreciated by those skilled in the art that suitable auto-calibration methods are known in the art per se and are not discussed in further detail herein. However, it should be noted that the principles of the present invention allow for a design that simultaneously realises lower power consumption and better phase noise.

In some embodiments, the amplitude regulator circuit portion comprises first, second, and third PMOS transistors, and first and second NMOS transistors, said amplitude regulator circuit portion being arranged such that:

an input node of the amplitude regulator circuit portion is connected to the input terminal of the inverter, a respective gate terminal of each of the first and second NMOS transistors, and a respective drain terminal of each of the first NMOS transistor and first PMOS transistor;

a drain terminal of the second NMOS transistor is connected to a drain terminal of the second PMOS transistor;

a respective source terminal of each of the first, second, and third PMOS transistors is connected to a positive supply rail;

a respective source terminal of each of the first and second NMOS transistors is connected to a negative supply rail or ground, wherein the source terminal of the second NMOS transistor is connected to the negative supply rail or ground via the trimmable resistor;

a respective gate terminal of each of the first, second, and third PMOS transistors are connected together; and a drain terminal of the third PMOS transistor is connected to (or is arranged for connection to) a current input of the inverter of the oscillator circuit portion.

It will be appreciated that in accordance with such an arrangement, the trimmable resistor is connected to the source terminal of the second NMOS transistor. As a result, trimming the resistance of the trimmable resistor will vary the voltage at the gate terminal of the second NMOS transistor.

In a particular set of embodiments, the respective channel width over channel length (W/L) value of the second NMOS transistor is approximately four times greater than the W/L value of the first NMOS transistor (i.e. N2:N1 is approximately 4:1). This is particularly advantageous because it results in the transconductance of the amplitude regulator being dependent only on the resistance value of the trimmable resistor.

Generally, the current through the second NMOS transistor is equal to the magnitude of the difference between the gate-source voltage $V_{gs1}$ of the first NMOS transistor and the gate-source voltage $V_{gs2}$ of the second NMOS transistor, divided by the resistance $R_1$ of the trimmable resistor in accordance with Equation 1 below:

$$I_2 = \frac{|V_{gs1} - V_{gs2}|}{R_1} = \frac{\Delta V_{gs}}{R_1} = \frac{\Delta V_{od}}{R_1} = I_1 = I \qquad \text{Equation 1}$$

The current through the first and third transistors where: I is the current, $I_1$ is the current through the first NMOS transistor, $I_2$ is the current through the second NMOS transistor, $V_{gs1}$ is the gate-source voltage of the first NMOS transistor, $V_{gs2}$ is the gate-source voltage of the second NMOS transistor, $\Delta V_{gs}$ is the difference in these gate-source voltages, $V_{od}$ is the difference between the gate-source voltage $V_{gs}$ and the threshold voltage $V^{th}$ for a given transistor (as outlined further below below) and thus $\Delta V_{od}$ is the difference between this value for the two NMOS transistors.

The transconductance g m is given as per Equation 2 below:

$$g_{m1} = \frac{2 \times I}{V_{od1}} = \frac{2(\Delta V_{od})}{(R1 \times V_{od1})} = (2 \times R1) \times \left(1 - \frac{V_{od2}}{V_{od1}}\right) = \frac{2}{R1}\left(1 - \frac{1}{\sqrt{m}}\right) \qquad \text{Equation 2}$$

The transconductance of the current source where: $g_{m1}$ is the transconductance of the first NMOS transistor, $V_{od1}$ is the difference between the respective gate-source voltage $V_{gs}$ and the threshold voltage $V_{th}$ of the first NMOS transistor, $V_{od2}$ is the difference between the respective gate-source voltage $V_{gs}$ and the threshold voltage $V_{th}$ of the second NMOS transistor, and m is the factor by which the aspect ratio W/L of the second NMOS transistor is greater than the aspect ratio W/L of the first NMOS transistor.

By using Equation 3 below:

$$\frac{V_{od2}}{V_{od1}} = \sqrt{\frac{W1}{W2}} = \frac{1}{\sqrt{(m)}} \qquad \text{Equation 3}$$

Relationship between the output voltages and the factor m and setting m to 4, then the transconductance of the first NMOS transistor $$g_{m1} = \frac{1}{R1},$$

and thus the transconductance $g_{m1}$ depends only on the resistance value $R_1$ of the trimmable resistor, thereby providing the constant-$g_m$ function of the current source for IPIERCE.

As discussed above, there are two different trimming methods that can be applied to such an amplitude regulator circuit, i.e. to set the operating point to zero or to a non-zero value. As outlined previously, the operating point can be set to zero by trimming the resistance value of the trimmable resistor to make the supply current equal the threshold value when the voltage at the input of the inverter Vamp_XC1 is zero.

With the non-zero approach, the DC bias point of the amplitude regulator can be set by forcing the gate voltage of the second NMOS transistor to a predetermined value. This sets the operating point, i.e. the value of Vamp_XC1 at which the supply current IPIERCE is equal to the threshold value. Thus if, for example, if the desired operating point is Vamp_XC1=300 mV, the gate voltage VGN2 of the second NMOS transistor can be forced to 300 mV plus a small additional voltage to account for the voltage drop across the gate-source threshold voltage of the second NMOS transistor. Thus if the gate-source threshold of the second NMOS transistor is 65 mV, the gate voltage VGN2 of the second NMOS transistor can be forced to 365 mV to set the operating point to 300 mV.

In general, the gate voltage of the second NMOS transistor plus a small additional voltage can be used to mimic the condition of DC component plus the AC component associated with a sine wave at the crystal input.

A low pass filter can time-average the alternating (e.g. sine wave) signal at the crystal input. If this alternating signal has a certain AC amplitude, the time-averaged value after passing through the low pass filter is a DC value plus a time-averaged sine AC amplitude. Thus, in a set of embodiments, the gate terminal of the second NMOS transistor is connected to the input node of the amplitude regulator circuit portion via a low pass filter. In a set of such embodiments, the low pass filter comprises a filter resistor and a filter capacitor arranged such that:
 a first terminal of the filter resistor is connected to the gate terminal of the first NMOS transistor;
 a second terminal of the filter resistor is connected to the gate terminal of the second NMOS transistor and to a first terminal of the filter capacitor; and
 a second terminal of the filter capacitor is connected to the negative supply rail or ground.

This low pass filter causes the conductance of the second NMOS transistor to be dependent on the time-average amplitude of the voltage at the input of the amplitude regulator (i.e. the input of the crystal in the crystal oscillator when connected), where the time-averaging is provided by the low pass filtering, as outlined above. Advantageously, this converts the AC information (i.e. the sine wave signal at the crystal input) to a DC-like value, which may be used to improve the generation of the supply current IPIERCE. This low pass filter also prevents high frequency fluctuations (e.g. due to noise) being applied to the gate terminal of the second NMOS transistor.

In a set of embodiments, a decoupling capacitor is connected between the gate terminal of the first NMOS transistor and the negative supply rail or ground. Such a decoupling capacitor may shunt high frequency components of the voltage at the gate terminal of the first NMOS transistor to ground (or to the negative supply, as appropriate).

As outlined above, where provided, the gate terminal of the first NMOS transistor is connected to the drain terminals of the first PMOS and first NMOS transistors. In a set of embodiments, the gate terminal of the first NMOS transistor is connected to the drain terminals of the first PMOS and first NMOS transistors via a resistor. In other words, this resistor (R2) sits between the gate and drain terminals of the first NMOS transistor. This may help to set the DC condition for the first NMOS transistor, i.e. to set it to its operating point.

As outlined above, the drain terminal of the third PMOS transistor is connected to the current input of the inverter of the oscillator circuit portion, and the gate terminal of the third PMOS transistor is connected to the gate terminal of the second PMOS transistor (and also the gate terminal of the first PMOS transistor). As the gate and drain terminals of the second PMOS transistor are connected together, the second and third PMOS transistors form a current mirror, such that the current through the second PMOS transistor is 'reflected' as the supply current supplied to the inverter. These two currents may be equal, or may be scaled in accordance with a ratio between the respective W/L values of the second and third PMOS transistors, as per a technique for current mirror design known in the art per se.

The current monitor monitors the current supplied to the inverter during operation and determines whether the voltage at the input terminal of the inverter is within the predetermined range. The current monitor may monitor the supply current directly, however in some embodiments the device comprises a current mirror arranged to provide generate a mirror current that depends on the current supplied to the inverter, wherein the current monitor receives said mirror current. The mirror current IP_COPY may be substantially identical to the current IPIERCE supplied to the inverter, or the mirror current IP_COPY may be a scaled copy of the supply current IPIERCE.

In particular set of embodiments, the amplitude regulator circuit portion comprises a fourth PMOS transistor arranged such that:
 a gate terminal of the fourth PMOS transistor is connected to the gate terminals of the second and third PMOS transistors and to the drain terminal of the second PMOS transistor;
 a source terminal of the fourth PMOS transistor is connected to the positive supply rail; and
 a drain terminal of the fourth PMOS transistor is connected to the current monitor.

The supply current may be a scaled to produce the mirror current in accordance with a ratio between the respective channel width over channel length (W/L) values of the third and fourth PMOS transistors, as per a technique for current mirror design known in the art per se. If the W/L ratio of the third PMOS transistor: W/L ratio of the fourth PMOS transistor is equal to n:1, the mirror current will generally be n times smaller than the current supplied to the inverter, i.e. IP_COPY=(IPIERCE/n).

Thus in accordance with such embodiments, the source-drain current through the second PMOS transistor may be 'reflected' through the respective current mirrors formed with the third and fourth PMOS transistors, where: the current through the second PMOS transistor is determined by the amplitude regulator loop; the current through the third PMOS transistor is supplied to the inverter (i.e. IPIERCE); and the current through the fourth PMOS transistor is supplied to the current monitor (i.e. IP_COPY).

In embodiments in which the current monitor comprises one or more current comparators, the drain terminal of the fourth PMOS transistor may be connected to a current input of the current comparator(s). Thus where a plurality of current comparators are provided for the current comparisons as outlined previously in respect of some embodiments of the invention, the drain terminal of the fourth PMOS transistor may be connected to a respective current input of each of the current comparators.

BRIEF DESCRIPTION OF DRAWINGS

Certain embodiments of the invention will now be described, by way of example only, with reference to the accompanying drawings in which.

DETAILED DESCRIPTION

Figure 1:
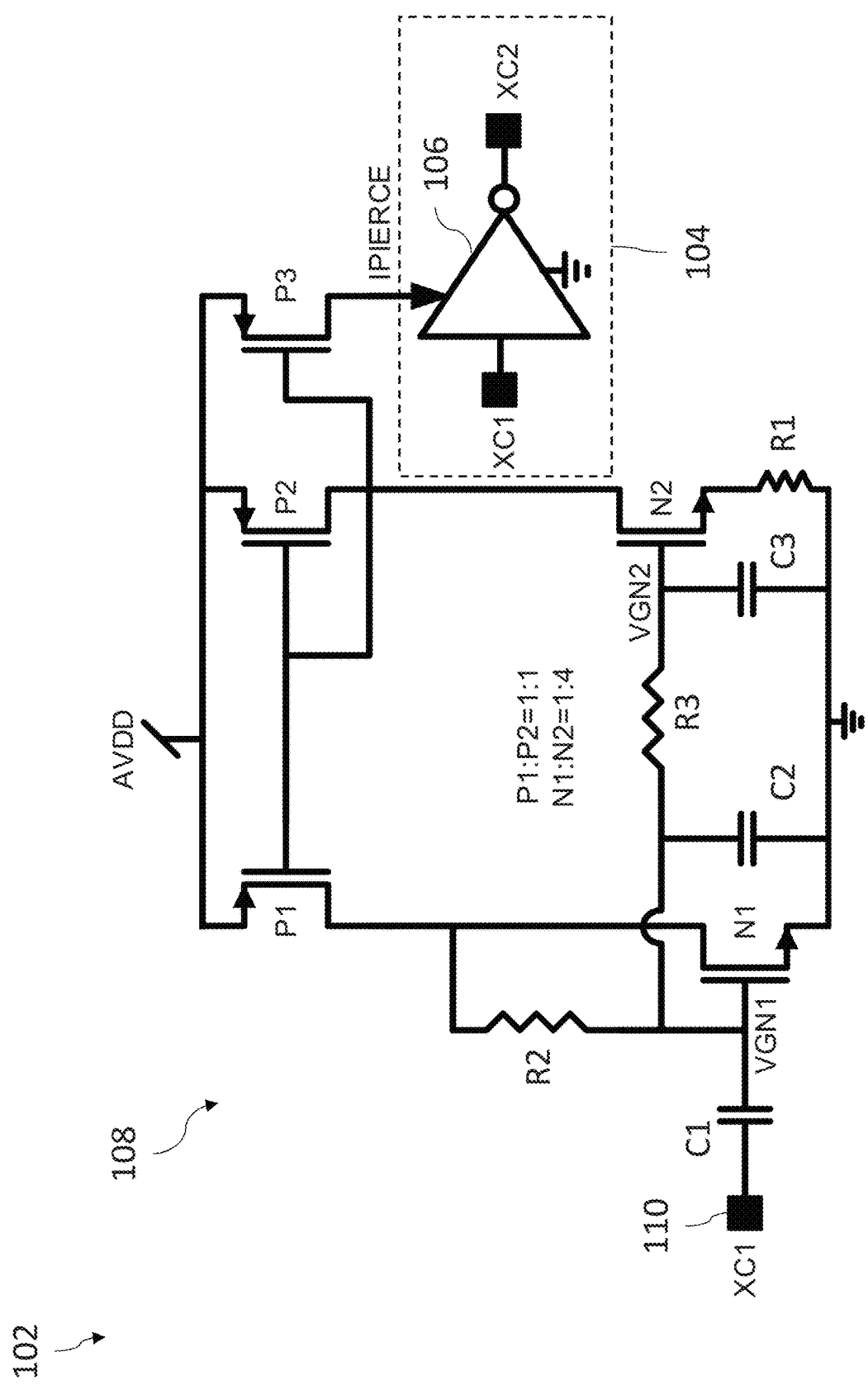
FIG. 1 is a circuit diagram of an electronic device including a typical amplitude regulator for use with a Pierce oscillator.

FIG. 1 is a circuit diagram of an electronic device 102 including a typical amplitude regulator 108 for use with a Pierce oscillator 104.

The device 102 comprises an oscillator circuit portion which in this example is a Pierce oscillator 104. The Pierce oscillator 104 includes a Pierce inverter 106 having an input terminal XC1 and an output terminal XC2, where a crystal oscillator would be connected between the input terminal XC1 and output terminal XC2 of the inverter 106. The crystal oscillator and any other circuitry relating to the Pierce oscillator 104 are not shown in FIG. 1, however there are many suitable topologies known in the art per se.

The device 102 also includes an amplitude regulator circuit portion 108 which is arranged to supply a current IPIERCE to the inverter 106 within the Pierce oscillator 104. The amplitude regulator 108 is arranged to monitor the voltage at the input terminal of the inverter 106 and to vary the current IPIERCE supplied to the inverter 106 in response to that monitored voltage.

The amplitude regulator 108 comprises first, second, and third PMOS transistors P1-3, and first and second NMOS transistors N1, N2. It will be appreciated that these transistors are conventional metal-oxide-semiconductor (MOS) field-effect-transistors (FETs) or 'MOSFETs'. Each transistor has a respective gate, drain, and source terminal as is typical for such devices, and their respective connections are outlined below.

The respective source terminal of each of the first, second, and third PMOS transistors is connected to a positive supply rail AVDD, while the respective source terminal of each of the first and second NMOS transistors N1, N2 is connected to ground. In particular, the source terminal of the second NMOS transistor N2 is connected to ground via a fixed resistor R1.

An input node 110 of the amplitude regulator 108 is connected to the input terminal XC1 of the inverter 106, the respective gate terminal of each of the first and second NMOS transistors N1, N2, and the respective drain terminal of each of the first NMOS transistor N1 and first PMOS transistor P1. An 'AC coupling' capacitor C1 is connected between the input node 110 and the gate terminal of N1, such that the first terminal of C1 is connected to the input node 110 and the second terminal of C1 is connected to the gate of N1.

A further resistor R2 is connected between the gate and drain terminals of the first NMOS transistor N1, where this resistor R2 sets the DC condition for the first NMOS transistor, i.e. sets N2 to its operating point.

The respective gate terminals of each of the first, second, and third PMOS transistors P1-3 are connected together and to the respective drain terminals of the second PMOS transistor P2 and second NMOS transistor N2. As a result, the second PMOS transistor P2 is 'diode connected' (i.e. due to the connection between its drain and gate terminals).

The drain terminal of the third PMOS transistor P3 is connected to a current input of the inverter 106 of the oscillator circuit portion 104, and the gate terminal of P3 is connected to the gate terminal of P2 (and also the gate terminal of P1). Due to this arrangement, the second and third PMOS transistors P2, P3 form a current mirror, such that the current through the second PMOS transistor P2 is 'reflected' as the Pierce current IPIERCE supplied to the Pierce inverter 106. These two currents may be equal, or may be scaled in accordance with a ratio of the W/L values of P2 and P3, as per a technique for current mirror design known in the art per se.

The amplitude regulator 108 operates to monitor the voltage at the input terminal XC1 of the inverter 106, i.e. the voltage at the input of the crystal connected between XC1 and XC2 within the Pierce oscillator 104.

A low pass filter, constructed from a filter resistor R3 and a filter capacitor C3, is connected between the input terminal 110 of the amplitude regulator 108 and the gate terminal of the second NMOS transistor N2.

Thus the voltage VGN2 applied to the gate terminal of N2 is a low pass filtered version of the voltage VGN1 applied to the gate terminal of N1, where the low pass filter function is provided by the first low pass filter R3, C3. This causes the conductance of the second NMOS transistor N2 to be dependent on the time-average amplitude of the voltage Vamp_XC1 at the input of the crystal in the crystal oscillator 104, where the time-averaging is provided by the low pass filtering. This low pass filter also prevents high frequency fluctuations (e.g. due to noise) being applied to the gate terminal of N2.

Thus while the amplitude of the voltage Vamp_XC1 at the input of the crystal in the crystal oscillator 104 remains below a certain value, which is set through the choice of component values of the resistors R1-3, N2 is relatively conductive, which causes a current to pass through the diode-connected second PMOS transistor P2. Due to the current mirror formed by P2 and P3, this current is then reflected through P3 as the Pierce current IPIERCE that is provided to the inverter 106 as outlined above. Thus when Vamp_XC1 is low, IPIERCE is brought high so as to help set up oscillations, and to reduce start-up time of the oscillator.

As the amplitude of the voltage Vamp_XC1 at the input of the crystal in the crystal oscillator 104 ramps up, it will eventually reach approximately the desired cut-off level and the conductance of N2 is reduced, thereby reducing the Pierce current IPIERCE. Thus once Vamp_XC1 grows sufficiently large, the current IPIERCE decreases to a level just enough to maintain oscillation.

Figure 2:
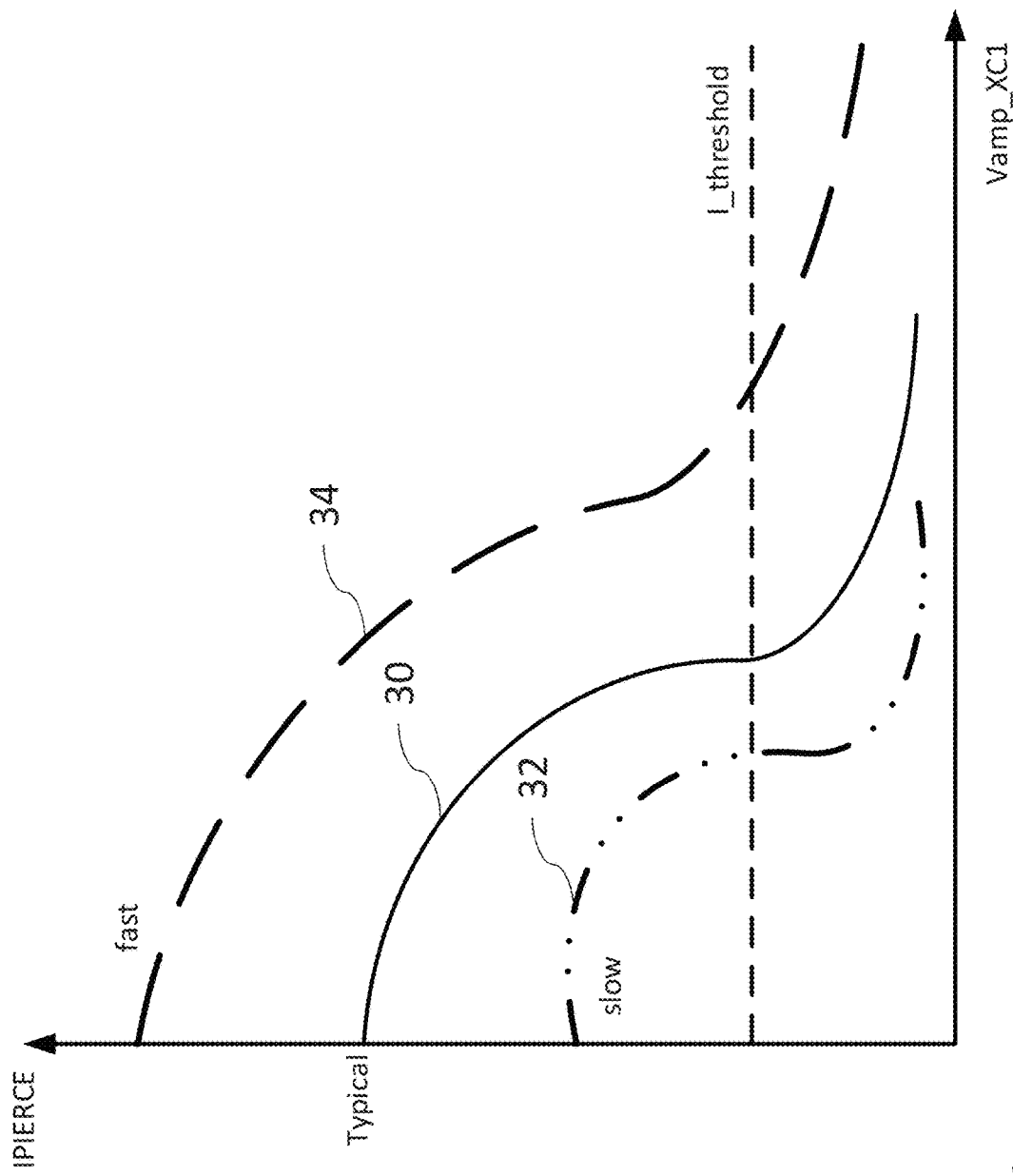
FIG. 2 is a graph showing a typical plot of IPIERCE vs Vamp_XC1 for a conventional amplitude regulator, known in the art per se.

FIG. 2 is a graph showing a typical plot of IPIERCE vs Vamp_XC1 for the amplitude regulator 108 of FIG. 1. In particular, the graph shows three plots for this relationship, including a plot for a typical case 30, a plot for a slow corner 32, and a plot for a fast corner 34.

As can be seen from FIG. 2, the value of Vamp_XC1 at which the supply current IPIERCE reaches the threshold current I_threshold is highly dependent on the process corner of the device. In particular, at fast corners (as shown in plot 34), IPIERCE drops to I_threshold at a higher voltage amplitude at the input of the crystal Vamp_XC1 than in the typical case. Conversely, at slow corners (as shown in plot 32), IPIERCE drops to I_threshold at a lower value of Vamp_XC1.

Due to this, the performance of the conventional amplitude regulator 108 can be unpredictable, and thus it can be difficult to optimise the phase noise and power consumption of the amplitude regulator 108 and associated oscillator circuit 104.

Figure 3:
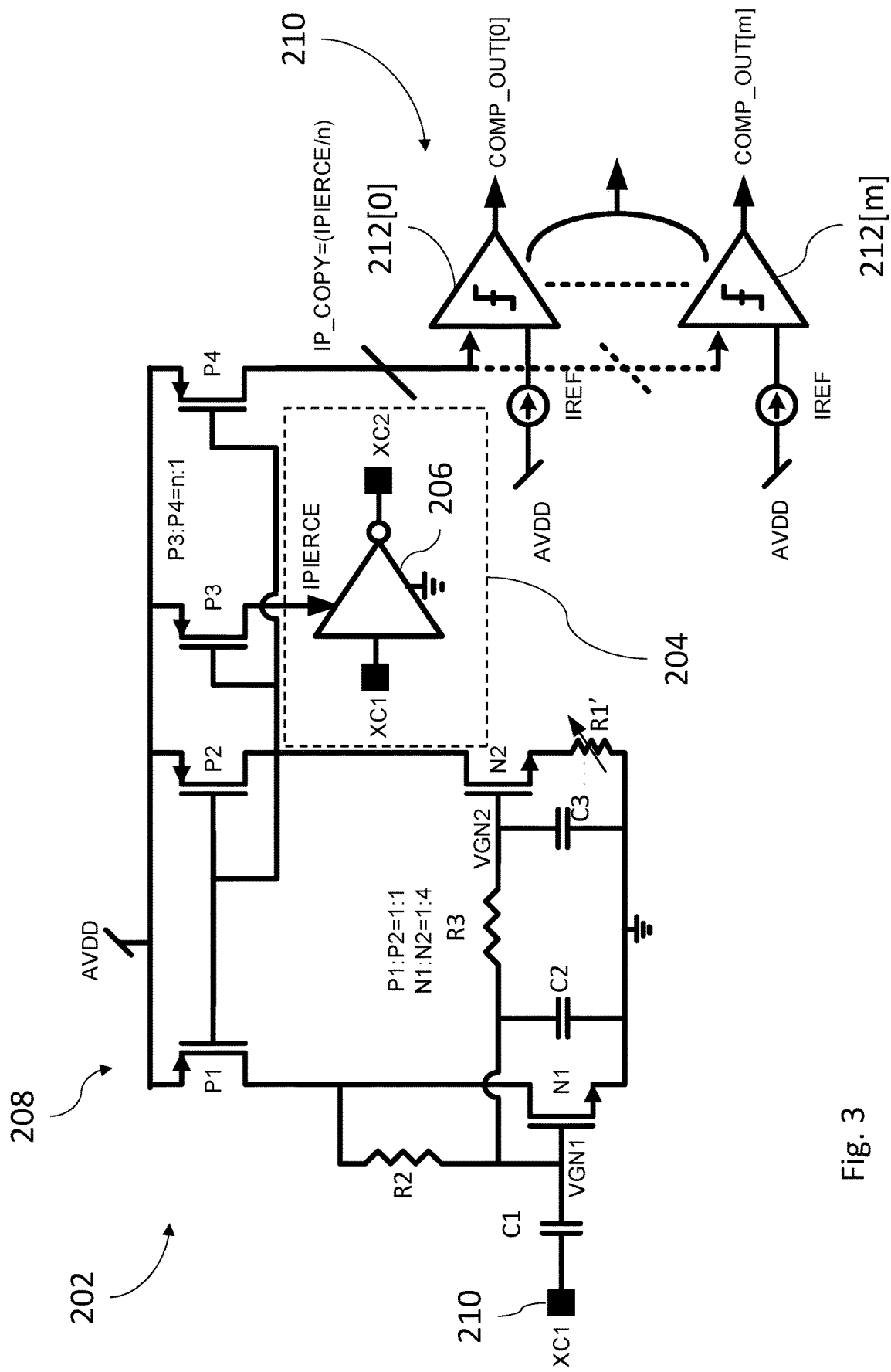
FIG. 3 is a circuit diagram of an electronic device including an amplitude regulator for use with a Pierce oscillator in accordance with an embodiment of the present invention.

FIG. 3 is a circuit diagram of an electronic device 202 including an amplitude regulator 208 for use with a Pierce oscillator 204 in accordance with an embodiment of the present invention. Portions of the circuit having a reference number starting with a '2' correspond in form and function to the portions having corresponding numbers starting with a '1' as outlined above in respect of FIG. 1, except where specified otherwise below.

The structure of the amplitude regulator 208 corresponds to the amplitude regulator 108 of FIG. 1, however the amplitude regulator 208 in accordance with an embodiment of the present invention has some additional features that, as is outlined below, advantageously allow the IPIERCE vs Vamp_XC1 curves for different corners to be brought closer together around a chosen operating point.

Firstly, in the amplitude regulator 208 of FIG. 3, the fixed resistor R1 used in the amplitude regulator 108 of FIG. 1 is replaced with a variable resistor R1' in the amplitude regulator 208 of FIG. 3. This 'trimmable' resistor R1' is arranged such that its resistance can be varied. In this particular example, the variable resistor R1' is constructed from a switched array of resistors, such that a suitable selection of the resistors in the array can be 'switched in' to set the overall resistance of the variable resistor R1' to a desired value suitable for a particular crystal being used in the crystal oscillator 204.

Additionally, the device 202 further comprises a current monitor 210, which includes a number 'm' of current comparators 212[0]-212[m], referred to collectively as current comparators 212. Each current comparator 212 receives a respective reference current IREF at a respective reference input of that comparator 212. While two comparators are shown in FIG. 3, it will be appreciated that this is for ease of illustration, and any suitable number may be selected, as depicted by the dashed lines between the comparators 212[0], 212[m] in FIG. 3.

The current monitor 210 receives a copy of the Pierce current IPIERCE supplied to the inverter 206, where the copied current IP_COPY is generated via an additional current mirror formed by a fourth PMOS transistor P4. P4 is arranged such that its source terminal is connected to the positive supply rail AVDD and its drain terminal is connected to a respective current input of each of the current comparators 212.

If the copy current IP_COPY (which is representative of the supply current (PIERCE) exceeds the respective current threshold of a given current comparator 212, that current comparator 212 raises a respective comparator flag COMP_OUT which indicates that the supply current IPIERCE exceeds its respective threshold. Different thresholds may be set by selecting an appropriate reference current IREF for each comparator 212 and/or by scaling the copy current IP_COPY by different factors for each comparator 212.

In a simple case, two comparators 212 may be used to check the supply current IPIERCE against upper and lower bounds. However, in practice, a more accurate determination of the value of IPIERCE may be made by having more comparators 212 (e.g. five comparators) to detect a narrower band in which the value of the current IPIERCE is at any given time, and thus a more accurate determination of the value of Vamp_XC1 can be made.

If either comparator 212, 214 raises its respective output COMP_H, COMP_L indicating that the supply current IPIECE is out-of-bounds (i.e. outside its predetermined range as set by the reference currents IREF_H, IREF_L), an auto-calibration process may be carried out in a manner known in the art per se.

Figure 4:
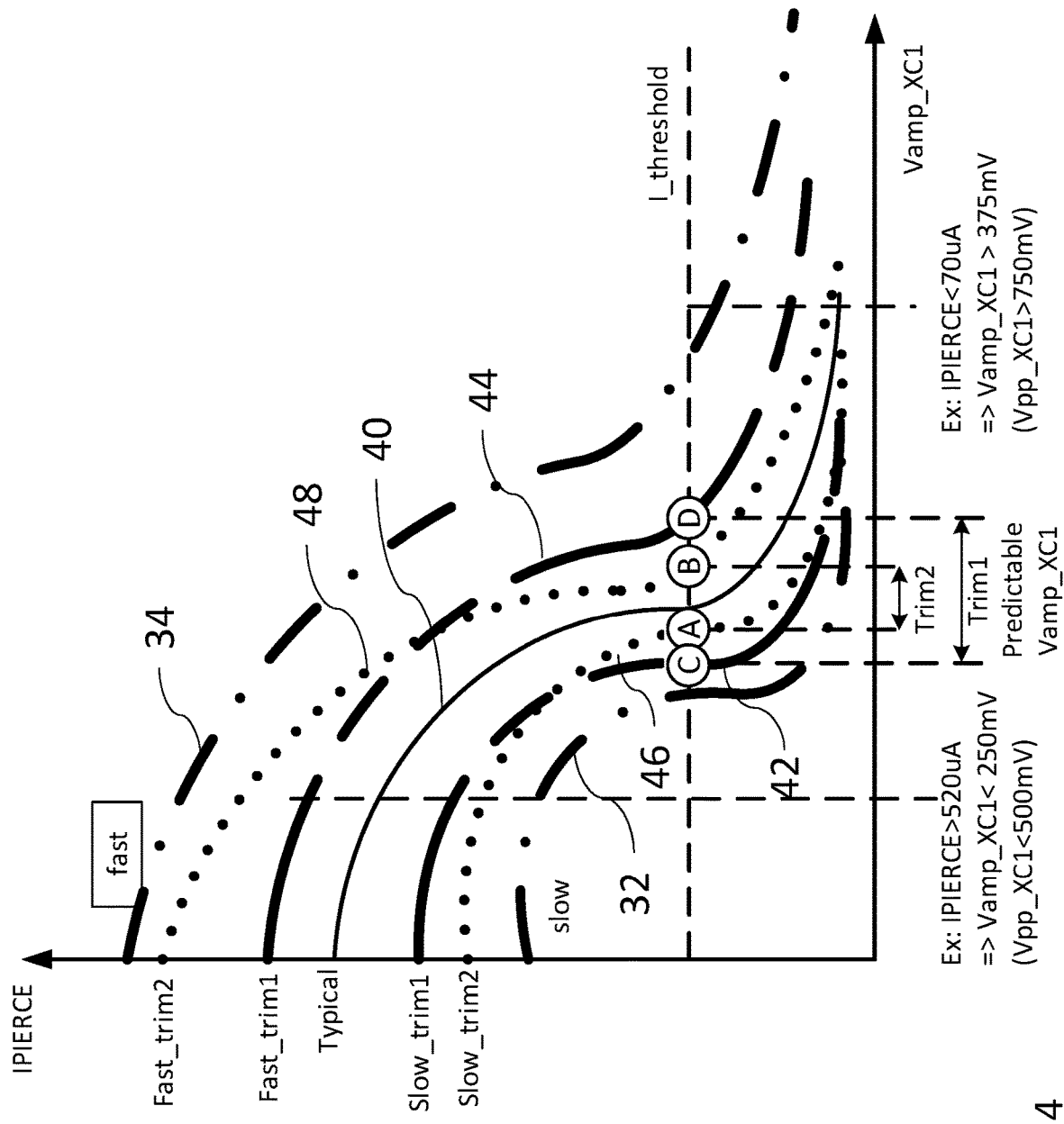
FIG. 4 is a graph showing a plot of IPIERCE vs Vamp_XC1 for the amplitude regulator of FIG. 3.

FIG. 4 is a graph showing a plot of IPIERCE vs Vamp_XC1 for the amplitude regulator 208 of FIG. 3 at different process corners. Specifically, FIG. 4 shows: a plot for a typical case 40; a slow corner plot 42 and fast corner plot 44 for the case where the amplitude regulator 208 is trimmed for when Vamp_XC1=0; and a slow corner plot 46 and fast corner plot 48 for the case where the amplitude regulator 208 is trimmed for a non-zero operating point.

The objective is to determine the value of Vamp_XC1 at I_threshold. In FIG. 4, the y-axis is the IPIERCE current supplied from the circuit when Vamp_XC1=0, i.e. the start-up condition. As outlined previously, in the start-up process, a larger supply current IPIERCE is usually provided to start oscillation. Once the oscillation is established and stable (i.e. under steady state conditions), it is generally desirable to keep the supply current IPIERCE just enough to maintain the oscillation only without exceeding this value. Having just enough supply IPIERCE is also good for the phase noise performance of the oscillator.

Additionally, FIG. 4 also shows the slow and fast plots 32, 34 associated with the conventional amplitude regulator 108, as discussed previously with respect to FIG. 2 for ease of comparison.

As can be seen in FIG. 4, by applying the trimming to R1' in the amplitude regulator 208 of FIG. 3, the respective plots for the slow and fast corners 42, 44 in the zero operating point and the respective plots for the slow and fast corners 46, 48 in the non-zero operating point are 'squeezed' closer together compared to the respective plots for the slow and fast corners 32, 34 associated with the conventional amplitude regulator 108 of FIG. 1. This indicates that there is less variation in the curves across the different corners for the amplitude regulator 208 of FIG. 3 when compared to the amplitude regulator 108 of FIG. 1.

In the first trimming case, R1' is trimmed such that the resistance of R1' is set to force IPIERCE=I_threshold when the voltage Vamp_XC1 is set to zero, i.e. at the DC typical condition. This results in the respective slow and fast plots 42, 44 being 'pinched' together, where the closest point between these plots is at the value of IPIERCE corresponding to when Vamp_XC1=0.

The respective points C and D where the respective slow and fast plots 42, 44 cross the I_threshold line are closer together than they are for the corresponding plots 32, 34 associated with the conventional amplitude regulator 108.

As determinations of the value of the voltage Vamp_XC1 are made based on the current IPIERCE being supplied, these points C, D being closer together are illustrative of an improvement in the predictability of the Vamp_XC1 value, i.e. estimates of Vamp_XC1 made from the known current IPIERCE being supplied by the amplitude regulator 208 of FIG. 3 are more accurate than with the conventional amplitude regulator 108 of FIG. 1.

In this first case where R1' is trimmed for Vamp_XC1=0, the slow and fast plots 42, 44 are closest together where Vamp_XC1=0. Thus while the threshold-crossing points C and D are closer together than in the conventional case, it is further advantageous to have the slow and faster corner plots closest together at the operating point, i.e. to minimise the variation in the possible IPIERCE vs Vamp_XC1 curves around the desired operating point, i.e. the value of Vamp_XC1 that is to be used during operation, rather than zero.

Thus in the second trimming case where R1' is trimmed to the resistance value that sets IPIERCE=I_threshold at a non-zero operational value of Vamp_XC1, this results in the respective slow and fast plots 46, 48 being pinched closest together at the operating point, i.e. where IPIERCE=I_threshold.

This results in the threshold-crossing points A, B (i.e. where plots 46, 48 cross I_threshold) corresponding to the points at which the slow and fast plots 46, 48 are closest, i.e. the predictability of Vamp_XC1 from supplied current IPIERCE is maximised at the operating point itself.

Thus, as outlined above, the trimming range is better for the second trimming case because it is narrower (i.e. the distance between point A and point B) at I_threshold than in the first trimming case (i.e. the distance between point C and point D).

It can be seen, therefore, that embodiments of the present invention provide an improved arrangement wherein the amplitude regulator that supplies the current to the oscillator circuit (which may be a Pierce oscillator) is arranged such that the trimmable resistor can be used to set the voltage at the input to the inverter (and thus the crystal) to a known value at the point at which the supply current is equal to the threshold current (i.e. the value at which the amplitude regulator is switched off). This may advantageously improve the predictability of the voltage at the input of the inverter (which is unknown at run time) from the current supplied to the inverter (which is known to the amplitude regulator) around that operating point.

Those skilled in the art will appreciate that the specific embodiments described herein are merely exemplary and that many variants within the scope of the invention are envisaged.

The invention claimed is:

1. An electronic device comprising:
    an oscillator circuit portion comprising an inverter having an input terminal and an output terminal, said oscillator circuit portion further comprising a crystal oscillator connected between the input and output terminals of the inverter;
    an amplitude regulator circuit portion arranged to supply a current to the inverter of the oscillator circuit portion, said amplitude regulator circuit portion being arranged to monitor a voltage at the input terminal of the inverter and to vary the current supplied to said inverter in response to said monitored voltage;
    wherein the amplitude regulator circuit portion comprises:
    a trimmable resistor arranged such that the voltage at the input terminal of the inverter is set to an operating point when the supply current provided by the amplitude regulator circuit portion is equal to a threshold value, wherein said operating point is at least partly determined by a selected resistance of the trimmable resistor; and
    a current monitor arranged to monitor the current supplied to the inverter during operation and to determine therefrom whether the voltage at the input terminal of the inverter is within a predetermined range;
    wherein the current monitor comprises a current comparator arranged to determine whether the voltage at the input terminal of the inverter is within the predetermined range.

2. The electronic device as claimed in claim 1, wherein the operating point is zero.

3. The electronic device as claimed in claim 1, wherein the operating point is a non-zero value.

4. The electronic device as claimed in claim 3, wherein the operating point is between approximately 200 mV and 400 mV, optionally between approximately 225 mV and 375 mV, further optionally between approximately 300 mV and 375 mV.

5. The electronic device as claimed in claim 4, wherein the operating point is approximately 300 mV.

6. The electronic device as claimed in claim 1, wherein the current comparator is arranged to compare the supply current to a lower bound and an upper bound, where the lower and upper bounds define the predetermined range.

7. The electronic device as claimed in claim 6, wherein the lower and upper bounds are provided to the comparator as lower and upper reference currents, respectively.

8. The electronic device as claimed in claim 1, wherein the current monitor comprises a plurality of current comparators each arranged to compare the supply current to a respective threshold value.

9. The electronic device as claimed in claim 8, wherein the current monitor comprises first and second current comparators, wherein the first current comparator compares the current supplied to the inverter to the lower bound; and wherein the second current comparator compares the current supplied to the inverter to the upper bound.

10. The electronic device as claimed in claim 9, wherein the lower and upper bounds are provided to the first and second comparators as lower and upper reference currents, respectively.

11. The electronic device as claimed in claim 1, wherein the amplitude regulator circuit portion comprises first, second, and third PMOS transistors, and first and second NMOS transistors, said amplitude regulator circuit portion being arranged such that:
    an input node of the amplitude regulator circuit portion is connected to the input terminal of the inverter, a respective gate terminal of each of the first and second NMOS transistors, and a respective drain terminal of each of the first NMOS transistor and first PMOS transistor;
    a drain terminal of the second NMOS transistor is connected to a drain terminal of the second PMOS transistor;
    a respective source terminal of each of the first, second, and third PMOS transistors is connected to a positive supply rail;
    a respective source terminal of each of the first and second NMOS transistors is connected to a negative supply rail or ground, wherein the source terminal of the second NMOS transistor is connected to the negative supply rail or ground via the trimmable resistor;
    a respective gate terminal of each of the first, second, and third PMOS transistors are connected together; and
    a drain terminal of the third PMOS transistor is connected to a current input of the inverter of the oscillator circuit portion.

12. The electronic device as claimed in claim 11, wherein the gate terminal of the second NMOS transistor is connected to the input node of the amplitude regulator circuit portion via a low pass filter wherein the low pass filter comprises a filter resistor and a filter capacitor arranged such that:
    a first terminal of the filter resistor is connected to the gate terminal of the first NMOS transistor;
    a second terminal of the filter resistor is connected to the gate terminal of the second NMOS transistor and to a first terminal of the filter capacitor; and
    a second terminal of the filter capacitor is connected to the negative supply rail or ground.

13. The electronic device as claimed in claim 11, wherein a decoupling capacitor is connected between the gate terminal of the first NMOS transistor and the negative supply rail or ground.

14. The electronic device as claimed in claim 11, wherein the gate terminal of the first NMOS transistor is connected to the drain terminals of the first PMOS and first NMOS transistors via a resistor.

15. The electronic device as claimed in claim 11, wherein the amplitude regulator circuit portion comprises a fourth PMOS transistor arranged such that:
- a gate terminal of the fourth PMOS transistor is connected to the gate terminals of the second and third PMOS transistors and to the drain terminal of the second PMOS transistor;
- a source terminal of the fourth PMOS transistor is connected to the positive supply rail; and
- a drain terminal of the fourth PMOS transistor is connected to the current monitor.

16. An amplitude regulator circuit portion arranged to supply a current to an inverter in an oscillator circuit portion, said amplitude regulator circuit portion being arranged to monitor a voltage at an input terminal of the inverter and to vary the current supplied to said inverter in response to said monitored voltage;
wherein the amplitude regulator circuit portion comprises:
- a trimmable resistor arranged such that the voltage at the input terminal of the inverter is set to an operating point when the supply current provided by the amplitude regulator circuit portion is equal to a threshold value, wherein said operating point is at least partly determined by a selected resistance of the trimmable resistor; and
- a current monitor arranged to monitor the current supplied to the inverter during operation and to determine therefrom whether the voltage at the input terminal of the inverter is within a predetermined range;
wherein the current monitor comprises a current comparator arranged to determine whether the voltage at the input terminal of the inverter is within the predetermined range.

17. The amplitude regulator circuit portion as claimed in claim 16, further comprising first, second, and third PMOS transistors, and first and second NMOS transistors, said amplitude regulator circuit portion being arranged such that:
- an input node of the amplitude regulator circuit portion is connected to the input terminal of the inverter, a respective gate terminal of each of the first and second NMOS transistors, and a respective drain terminal of each of the first NMOS transistor and first PMOS transistor;
- a drain terminal of the second NMOS transistor is connected to a drain terminal of the second PMOS transistor;
- a respective source terminal of each of the first, second, and third PMOS transistors is connected to a positive supply rail;
- a respective source terminal of each of the first and second NMOS transistors is connected to a negative supply rail or ground, wherein the source terminal of the second NMOS transistor is connected to the negative supply rail or ground via the trimmable resistor;
- a respective gate terminal of each of the first, second, and third PMOS transistors are connected together; and
- a drain terminal of the third PMOS transistor is arranged for connection to a current input of the inverter of the oscillator circuit portion.

* * * * *